US008412588B1

(12) United States Patent
Bodell et al.

(10) Patent No.: US 8,412,588 B1
(45) Date of Patent: Apr. 2, 2013

(54) SYSTEMS AND METHODS FOR FABRICATING PRODUCTS ON DEMAND

(75) Inventors: Colin Bodell, Seattle, WA (US);
Gregory J. Meyers, Newcastle, WA (US); Jeremy E. Powers, Vashon, WA (US); Bryan K. Beatty, Issaquah, WA (US); Michael G. Curtis, Sammamish, WA (US); Jeffrey B. Slosberg, Seattle, WA (US); Leon L. Au, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 171 days.

(21) Appl. No.: 12/890,334

(22) Filed: Sep. 24, 2010

(51) Int. Cl.
*G06Q 30/00* (2012.01)
(52) U.S. Cl. ....... 705/26.5; 716/110; 715/716; 706/919; 700/119; 700/163
(58) Field of Classification Search ........ 705/26.1–27.2; 716/110–139; 715/716–759; 706/919; 700/119, 700/163
See application file for complete search history.

(56) References Cited

U.S. PATENT DOCUMENTS

| | | | |
|---|---|---|---|
| 7,639,386 B1 | 12/2009 | Siegel et al. | |
| 2002/0072979 A1* | 6/2002 | Sinha et al. | 705/26 |
| 2002/0107751 A1* | 8/2002 | Rajagopalan et al. | 705/26 |
| 2005/0102240 A1* | 5/2005 | Misra et al. | 705/59 |
| 2007/0244763 A1* | 10/2007 | Williams et al. | 705/26 |
| 2008/0111816 A1* | 5/2008 | Abraham et al. | 345/420 |
| 2009/0254457 A1* | 10/2009 | Folsom | 705/27 |
| 2009/0303507 A1* | 12/2009 | Abeloe | 358/1.9 |
| 2010/0287065 A1* | 11/2010 | Alivandi | 705/26 |
| 2011/0087350 A1* | 4/2011 | Fogel et al. | 700/98 |
| 2011/0246331 A1* | 10/2011 | Luther et al. | 705/27.1 |
| 2012/0078592 A1* | 3/2012 | Sims, Jr. | 703/1 |

OTHER PUBLICATIONS www.3dcontentcentral.com. Feb. 27, 2009. [recovered from www.Archive.org].*
Charleton, G., Printing in Three Dimensions, http://news.discovery.com/tech/printing-in-3d.html, Sep. 10, 2010, 9 pages, Discovery Communications, LLC.
Custom Gifts, http://cafepress.com/make/personalized-gifts, Oct. 25, 2010, 3 pages, CafePress.
Custom T-shirts, Personalized T-shirts and Photo T-Shirts, http://cafepress.com/make/custom-t-shirts, Oct. 25, 2010, 4 pages, CafePress.
Photo Mugs, Personalized Mugs and Custom Mugs, http://www.cafepress.com/make/custom-mugs, Oct. 25, 2010, 2 pages, CafePress.
Vance, A., 3-D Printing Spurs a Manufacturing Revolution, http://www.nytimes.com/2010/09/14/technology/14print.html?_r=1&pagewanted=print, Sep. 13, 2010, 4 pages, NYTimes.com, San Francisco.
Product Description, "SolidWorks Premium 2010—The Complete 3D CAD Solution for Designing Better Product" —4 pages.

(Continued)

*Primary Examiner* — William Allen
(74) *Attorney, Agent, or Firm* — Knobbe Martens Olson & Bear LLP

(57) ABSTRACT

Systems and methods are provided for fabricating products on demand. In some embodiments, a manufacturable model, which may include information about a three-dimensional representation of a product to be fabricated, is received by a user of an electronic system and may be validated by the electronic system. A prototype of the product can be generated based at least in part on the manufacturable model, and the manufacturable model and/or the product can be made available for selection by other users of the system. The product may be fabricated based at least in part on the manufacturable model using, for example, a three-dimensional printer, and may be delivered to users of the electronic system.

23 Claims, 8 Drawing Sheets

OTHER PUBLICATIONS

3D Design Premium, http://www.solidworks.com/sw/products/mechanical-engineering-cad-software.htm, 1 page, Jul. 11, 2012, SolidWorks.

Simulation Premium, http://www.solidworks.com/sw/products/10172_ENU_HTML.htm, Jul. 11, 2012, 1 page, SolidWorks.

Free 3D Models, Free CAD Models, http://www.3dcontentcentral.com/default.aspx, Jul. 11, 2012, 4 pages, 3D ContentCentral.

My 3D ContentCentral, http://www.3dcontentcentral.com/My3DCC.aspx?ReturnUrl=%2fmy%2fdefault.aspx, Jul. 11, 2012, 1 page, 3D ContentCentral.

Find Free Cad Drawings, 3D Models on 3D ContentCentral, http://www.3dcontentcentral.com/Browse.aspx?eventSource=mnuFindContent, Jul. 11, 2012, 3 pages, 3D ContentCentral.

* cited by examiner

SYSTEMS AND METHODS FOR FABRICATING PRODUCTS ON DEMAND

BACKGROUND

Digital manufacturing, rapid prototyping, desktop manufacturing, and/or personal fabrication systems (generally, "three dimensional (3D) printers") include forms of additive manufacturing technology where a three dimensional object is fabricated by successive layers of material. Analogously to the way that conventional (two dimensional) desktop printers provide computer users with a paper output of their documents, 3D printers can provide 3D computer-aided-design (CAD) users a physical prototype of real world objects. 3D printers can include technologies using inkjet printing to deposit layers of plaster or resins, light projection systems (e.g., stereolithography) to expose and harden liquid polymers, fused deposition modeling to deposit layers of polymer, laser sintering to fuse small particles, and so forth.

3D printers may be faster, more affordable and easier to use than other commercial additive manufacturing technologies. Some types of 3D printers offer product developers the ability to print parts or assemblies made of several materials with different mechanical and physical properties in a single build process. 3D printing technologies can yield models that closely emulate the look, feel and functionality of product prototypes. Recently, some 3D printers have become economically accessible to smaller businesses and personal users, thereby allowing prototyping and product fabrication to be performed by such businesses and users. 3D printing technology can be used in, for example, consumer products, industrial design, engineering, automotive, and medical industries.

BRIEF DESCRIPTION OF THE DRAWINGS

Various aspects of the disclosure and many of the attendant advantages will become more readily appreciated as the same become better understood by reference to the following detailed description, when taken in conjunction with the accompanying drawings.

The above-described drawings and the following detailed description are provided to illustrate example embodiments and are not intended to limit the scope of the disclosure.

DETAILED DESCRIPTION 3D printers are typically not readily available to every person who conceives of a product to fabricate. In some cases, the conceiver of the product may only want to fabricate a single item. However, the item (or a 3D manufacturing model from which the product can be fabricated) may be of interest to others. Accordingly, certain aspects of the present disclosure relate to providing an electronic system that provides a catalog of items available for selection by users of the system, and methods of fabricating the selected items using 3D printing technology. In some examples, the 3D printing technology may be local to the electronic system. In some other examples, the 3D printing technology may be remote to the electronic system. In some embodiments, the items selected by the users may be products to fabricate. In some embodiments, the items selected may be one or more components of a final product or kits of components of products for assembly by a user. Some or all of the components may be pre-assembled for the user. Assembly instructions or instructions for use may be provided with the kit (e.g., as a downloadable electronic document). The electronic system may also be used to help users enter and edit manufacturing models used by a 3D printing system to produce a component, kit, or product. In some examples described herein, it is to be understood that at the request of a particular user, the electronic system fabricates and delivers an item to the particular user.

Figure 1:
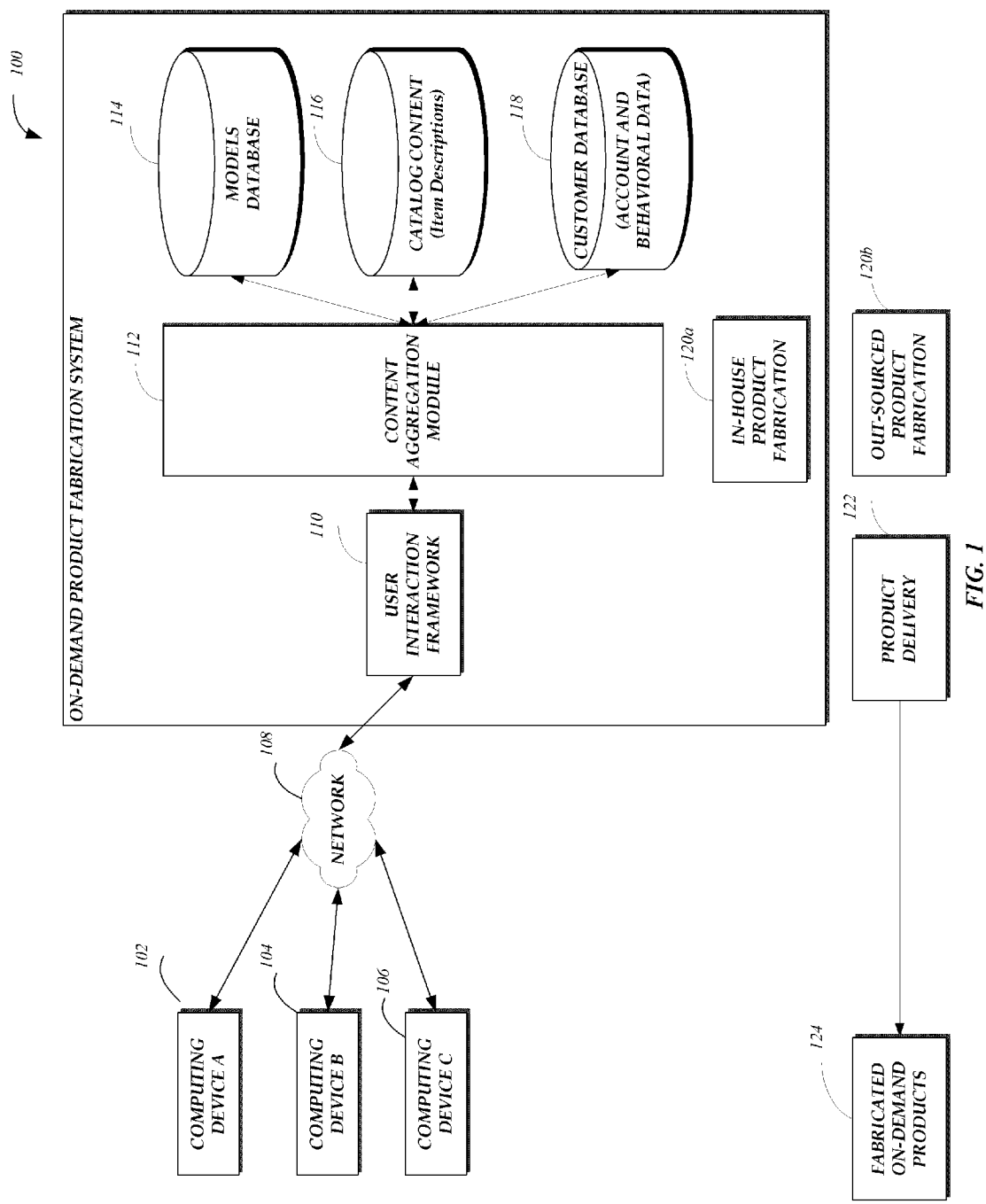
FIG. 1 is a block diagram showing an example implementation of an embodiment of a system for fabricating products on-demand.

FIG. 1 is a block diagram showing an example implementation of an embodiment of a system 100 for fabricating products on-demand. The on-demand fabrication system 100 may have an electronic catalog of products that are available to users. For example, a user at computing devices 102, 104, 106 may access the on-demand product fabrication system 100 to select a product (e.g., by viewing an item detail display page for the product) and then receive the product 124, which can be fabricated on-demand for the user. The computing devices 102, 104 and 106 may be any of a number of computing devices that are capable of communicating over a network 108 including, but not limited to, a laptop, personal computer, personal digital assistant (PDA), hybrid PDA/mobile phone, mobile phone, electronic book reader, digital media player, and the like. While not illustrated in detail in FIG. 1, the on-demand product fabrication system 100 and/or the computing devices 102, 104 and 106 may comprise one or more central processing units (CPUs), input/output devices, and one or more computer memories. Among the input/output devices may be storage devices, such as a hard disk drive; a computer-readable media drive, which can be used to install software products, including aspects of the facility or system, which are provided on a computer-readable medium, such as a CD-ROM; and a network connection for connecting to other computer systems. While the on-demand product fabrication system 100 and the computing devices 102, 104 and 106 may be implemented on a computer system or other device configured as described above, they may also be implemented on computer systems and devices having different configurations.

The products can be fabricated based at least in part on a manufacturable model (e.g., a 3D CAD model) that includes information that can be used to control a machine (e.g., a 3D printer) that fabricates the product. For example, the manufacturable model can be used with a computer numerically controlled (CNC) machine to fabricate the product. Products may include any tangible output of the on-demand product fabrication system 100, and may include items such as stand-alone products, product components, kits of components to assemble into stand-alone products, etc. In some embodiments, a user may select the manufacturable model from the on-demand fabrication system 100 in addition to, or instead of, the fabricated product 123. For example, the user may receive the fabricated product 124 from a product delivery service 122 and/or the manufacturable model (e.g., via electronic download over the network 108).

The on-demand product fabrication system 100 may include various components such as a user interaction framework 110 and a content aggregation module 112. The content aggregation module 112 may communicate or be coupled to one or more databases such as, e.g., a models database 114, a catalog content database 116, or a customer database 118. These databases 114, 116, and 118 may provide models and/or a set of existing content (as well as indications of future content) from which the user may select to fabricate the on-demand product 124. For example, a models database 114 may include information about manufacturable models of products, while a catalog content database 116 may include information about products that may be fabricated from the models stored in the database 114. In addition to or instead of storing digital content, the databases 114, 116, and 118 may also store indications of content stored external to the facility. For example, one or more of the databases 114, 116, and 118 may include references or pointers to items stored in an external data source. In some embodiments, a separate data storage facility (not shown) may be used for storing such references, pointers, or databases. The databases 114, 116, 118 need not be separate databases but may be included in one or more combined databases. While specific examples of content are described herein, the on-demand product fabrication system 100 may provide or access virtually any type of manufacturable model or previously produced product. In addition to drawing from more traditional types of content, other less conventional sources may be used to generate products on-demand. For example, the on-demand product fabrication system 100 may draw on product information from product manufacturer or retailer databases to generate customized products that are tailored to a user. In another example, the on-demand product fabrication system 100 may access various search engines to generate products that may also use the on-demand product to be fabricated.

The content aggregation module 112 of the on-demand product fabrication system 100, which will be described below in more detail, may be connected to or in communication with a customer database 118 that stores customer information, such as customer shipping information associated with customers who have selected one or more items available via the user interaction framework 110. The customer data stored in customer database 118 may include customer shipping information. In some embodiments, customer database 118 may also include customer account and/or behavioral data. Customer account data may include, for example, usernames, passwords, payment information, item ratings, and wish lists. Behavioral data may be data reflective of a customer's browsing activity. For example, the behavioral data may include item selection data for users of the user interaction framework 110. The item selection data may include purchase histories, search histories, and item viewing histories. Purchase histories can include purchases or rentals of items for physical delivery or electronic download. The item selection data may also include likes and preferences of the customer for items, categories of items, product designers, model designers, authors, artists, directors, genres, etc.

In some embodiments, the customer database 118 may include user history information that the on-demand product fabrication system 100 may use to generate recommendations for a user. The customer database 118 may also store preferences that allow the content aggregation module 112 to select catalog content to present to that user. In this way, the on-demand product fabrication system 100 may alert the user to the possibility of incorporating previously designed products as a sub-component of a different product previously viewed or selected by the user.

In various embodiments, the customer database 118 may be local to the on-demand product fabrication system 100, may be local to the content aggregation module 112, maybe be remote from both the on-demand product fabrication system 100 and content aggregation module 112, and/or may be a network-based service itself. In the embodiment shown in FIG. 1, users of the system 100 may utilize the one or more computing devices 102, 104 and 106 to communicate with the user interaction framework 110 via a communication network 108, such as the Internet or other communications link. The network 108 may be any wired network, wireless network, or combination thereof. The network 108 may be a personal area network, local area network, wide area network, cable network, satellite network, cellular telephone network, etc. or combination thereof. Various protocols, Application Programming Interfaces (APIs), and components for communicating via the Internet or any of the other aforementioned types of communication networks may be used.

Upon establishing a connection with the on-demand product fabrication system 100, the user may access tools associated with the user interaction framework 110 to input a manufacturable model of a product to be fabricated on demand, and the model may be sent via the network 108 and the user interaction framework 110 to the model database 114 for storage. The user may use additional tools associated with the user interaction framework 110 to finalize the model. Examples of various tools provided by the user interaction framework 110 are described in more detail with respect to FIG. 2 below. The tools provided by the user interaction framework 110 may be either local or remote.

In another embodiment, the user may access the catalog content database 116 to select a product fabricated on demand for another user, and request to have that product, components of that product, or a kit of sub-parts of that product fabricated. In cases where the on-demand product fabrication system 100 is fabricating on-demand products based on a pre-existing model in the models database 114, the user interaction framework 110 may retrieve such information from the models database 114 without the need for further user interaction.

Other components associated with the on-demand product fabrication system 100 may include a product delivery system 122 and a product fabrication system, which may be "in-house" 120a (e.g. provided by the system 100) or outsourced 120b (e.g., provided by a third party). After selecting a model and/or a product, the user, via the user interaction framework 110, may receive a fabricated on demand product 124. In some embodiments, the product fabrication system 120a may be local to the on-demand product fabrication system 100, and in other embodiments, the product fabrication system 120b may be remote to the on-demand product fabrication system 100. The product fabrication systems 120a, 120b may include one or more three-dimensional (3D) printing devices, which may vary in type, function, location, etc. Some 3D printing devices may include 3D milling machines, computed numerically controlled (CNC) machines, laser-cutter machines, and the like. The 3D printing devices may utilize technologies such as, e.g., inkjet printers to deposit layers of plaster or resins, light projection systems (e.g., stereolithography) to expose and harden liquid polymers, fused deposition modeling systems to deposit layers of polymer, laser sintering systems to fuse small particles, and so forth.

As one illustrative example, the on-demand product fabrication system 100 may send a fabrication request for a single product to a local product fabrication system 120a and may send a high-volume product fabrication request to a third-party product fabrication system 120b capable of handling large jobs. After production, the product delivery system 122 may deliver the fabricated on-demand products 124 to the user via a variety of delivery source (e.g., airmail, ground shipping, etc.). In some embodiments, the on-demand product fabrication system 100 may provide the user with a 3D-printable electronic copy of the manufacturable model via, for example, electronic download, email, web page, telecommunications transmission, etc., to enabling fabrication of the product under the user's control. In certain implementations, the fabrication request is communicated to a product fabrication system 120a, 120b that is located geographically close to the user. In some such implementations, the user may go directly to the product fabrication system 120a, 120b to pick up the fabricated product.

Figure 2:
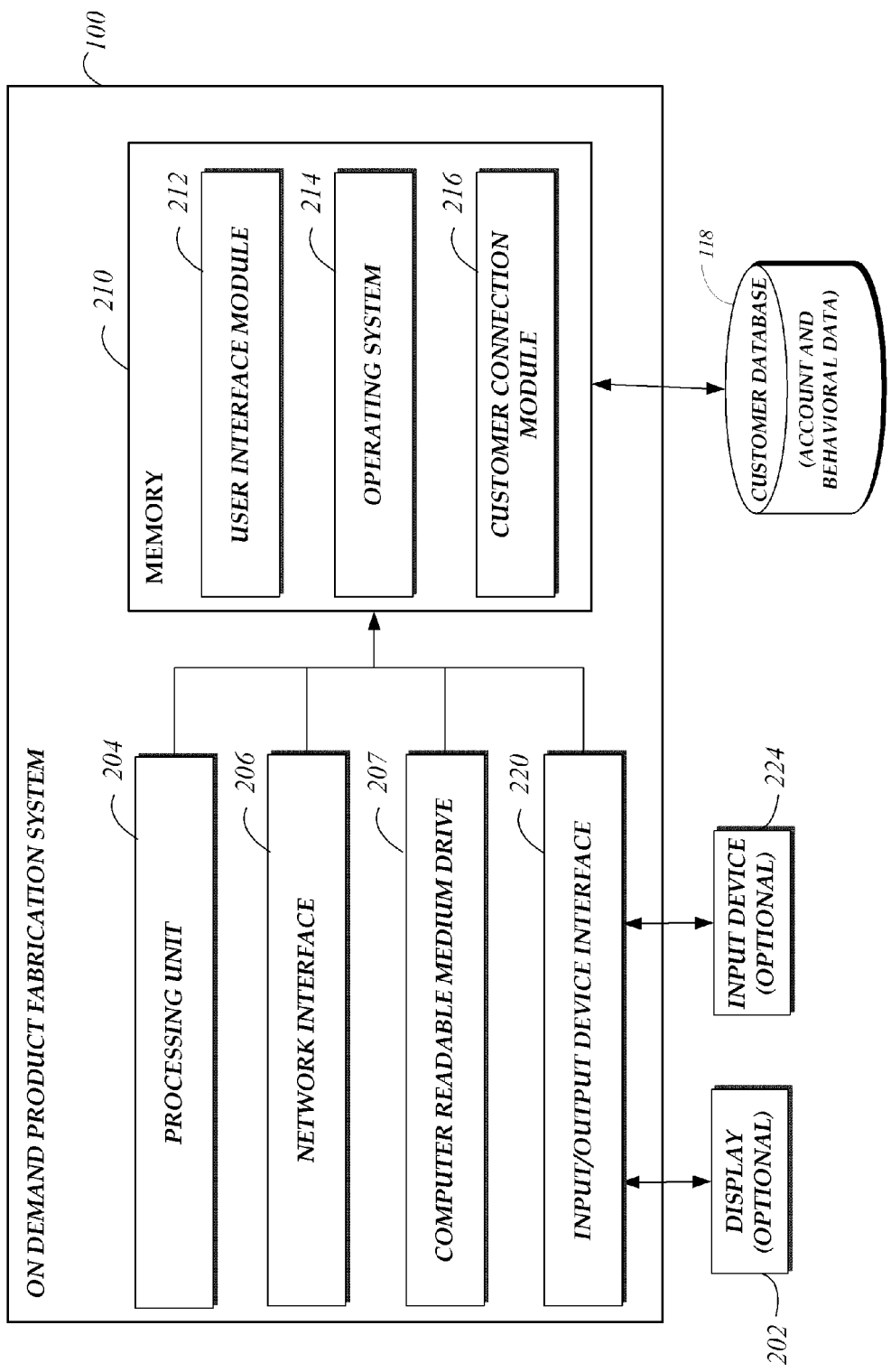
FIG. 2 depicts an example of general architecture of an embodiment of an on-demand product fabrication system.

FIG. 2 depicts an example of a general architecture of an embodiment of the on-demand product fabrication system 100. The general architecture of the on-demand product fabrication system 100 depicted in FIG. 2 includes an arrangement of computer hardware and software components that may be used to implement aspects of the present disclosure. The on-demand product fabrication system 100 may include many more (or fewer) components than those shown in FIG. 2. As illustrated, the on-demand product fabrication system 100 includes a network interface 206, a processing unit 204, an input/output device interface 220, an optional display 202, an optional input device 224, and a computer readable medium drive 207, all of which may communicate with one another by way of a communication bus. The network interface 206 may provide connectivity to one or more networks such as, e.g., the network 108, or computing systems such as, e.g., the computing systems 102-106. The processing unit 204 may thus receive information and instructions from other computing systems or services via a network. The processing unit 204 may also communicate to and from memory 210 and further provide output information for an optional display 202 via the input/output device interface 220. The input/output device interface 220 may also accept input from an optional input device 224, such as a keyboard, mouse, digital pen, etc.

The memory 210 contains computer program instructions that the processing unit 204 executes in order to implement one or more embodiments. The memory 210 generally includes RAM, ROM and/or other persistent memory. The memory 210 may store an operating system 214 that provides computer program instructions for use by the processing unit 204 in the general administration and operation of the on-demand product fabrication system 100. The memory 210 may further include computer program instructions and other information for implementing aspects of the present disclosure. For example, in one embodiment, the memory 210 includes a user interface module 212 that generates user interfaces (and/or instructions therefor) for display upon a computing device, e.g., via a navigation interface such as a web browser installed on the computing device. The user interface module 212 may, in some embodiments, implement the functionality of the user interaction framework 110. In addition, memory 210 may include or communicate with a customer database 118. Data stored in the customer database 118 may include customer shipping information, for example.

In addition to the user interface module 212, the memory 210 may include a customer connection module 216 that may be executed by the processing unit 204. In one embodiment, the customer connection module 216 can implement the content aggregation module 112 and may be in communication with one or more databases (e.g., the database 118 shown in FIG. 2).

Figure 3:
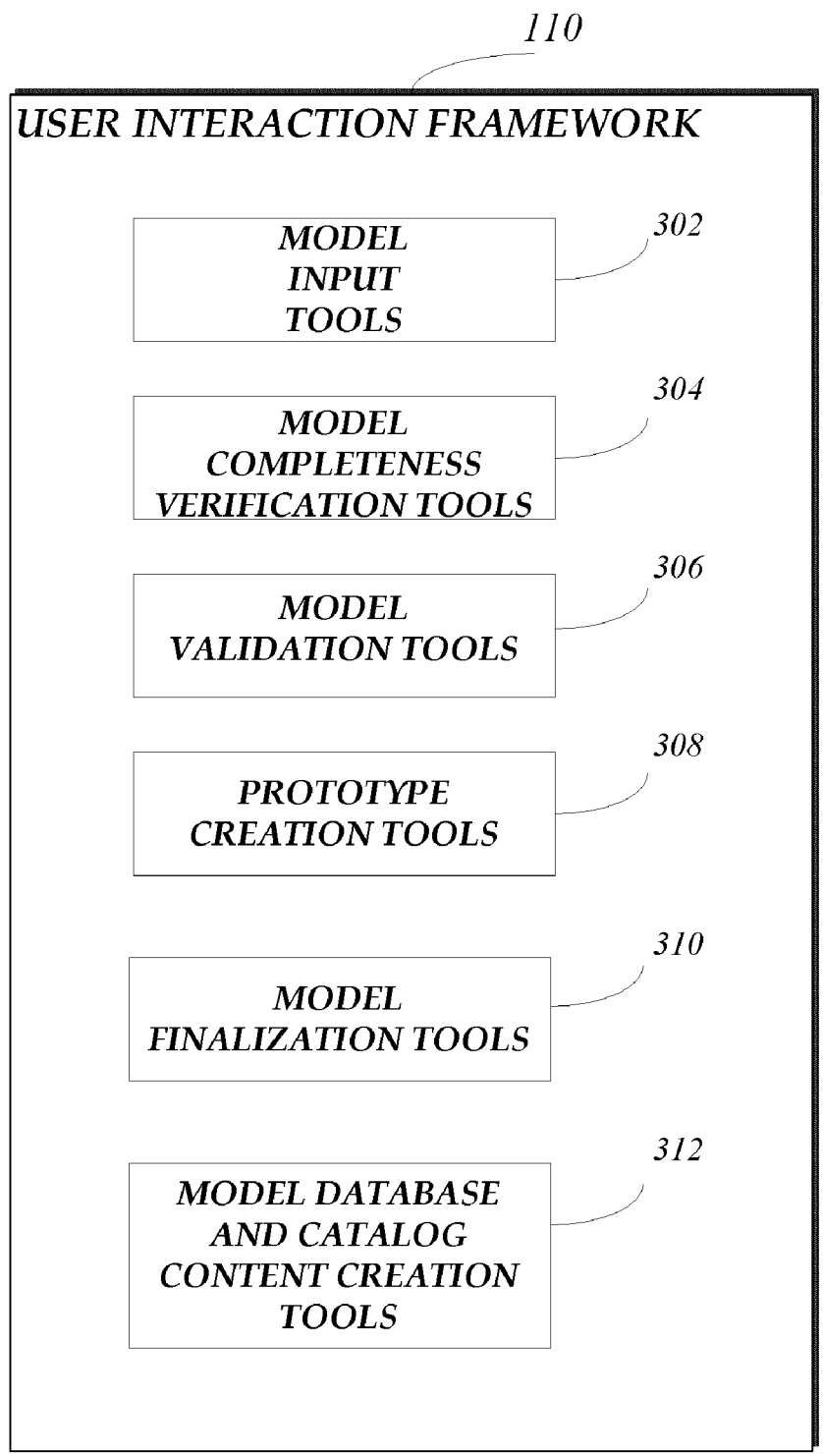
FIG. 3 is a block diagram showing an example embodiment of the user interaction framework of the system of FIG. 2.

FIG. 3 is a block diagram showing an example embodiment of the user interaction framework 110 of the system of FIG. 1. The user interaction framework 110 may provide various tools to allow a user to input, to validate and finalize a model for fabrication, to create a physical prototype of the product and catalog content about the model and/or product. For example, the user interaction framework 110 may include model input tools 302, model completeness verification tools 304, model validation tools 306, prototype creation tools 308, model finalization tools 312, catalog content creation tools 314, and so forth.

In some embodiments, the model input tools 302 may be used to allow the system 100 to receive a manufacturable model of a product to be fabricated on demand. The manufacturable model may include information about dimensions, shapes, tolerances, materials, fabrication processes, and other data or requirements related to the product to be fabricated. For example, the manufacturable model may comprise a 3D CAD model (e.g., AutoCAD™ or Solidworks™ data files) that provides a three-dimensional representation of an object. The model completeness verification tools 304 may be used to determine whether the model received from the user is a suitable manufacturable model that can be used by the fabrication systems 102a, 102b to fabricate a tangible version of the product described by the model. The verification may include determining whether the received model is in the correct format, includes the appropriate files (e.g., drawing files, part files, assembly files, etc.), etc. The model completeness verification tools 304 may also be used to request further information from the user. For example, if the model input by the user is not a three-dimensional representation of the product, the user interaction framework 110 may request further input by the user, such as a photograph of the product to be fabricated.

Once the model has been verified to be complete as a manufacturable model, the model validation tools 306 may be used to, for example, validate or analyze, for the manufacturable model or a product fabricated based on the model, the representation of product dimensions or configuration, representation of material tolerances, sensitivity to different fabrication or performance scenarios, compliance with industry, regulatory, quality, or safety standards, etc. For example, the tools 306 may include a set of consistency checking rules to facilitate validating the 3D configuration of the product from the model. The tools 306 may also provide error messages to aid the designer to make corrections or alterations to the model. In some implementations, the tools 306 can be configured to test product designs for defects before prototypes are fabricated. The model validation tools 306 may help the user improve or optimize the model. For example, the model validation tools 306 may be used to subject the model to similar conditions as in the real world, including, e.g., stresses, impact, heat, airflow, and the like. In some embodiments, the model validation tools 306 may receive user-provided attributes relating to how the fabricated product might perform under various environmental conditions or scenarios. The user (or system) may make such a determination by using the model validation tools 306 to subject the model of the product to a simulation of environmental conditions using the attributes provided. As one possible example, the model validation tools 306 may be used to determine whether the fabricated product might be top-heavy and therefore likely to tip over under expected loads or stresses. The user or the system may then use the result of the model validation tools 306 to make corrections or changes to the model, if necessary or desired. Continuing with the above example, the user (or system) may decide to change the weight distribution of materials represented in the model to decrease the likelihood that the product may tip over.

The model validation tools 306 may also help the user determine whether moving parts clash or interfere with one another, how much weight a product may carry, how much a part may deform under specific stresses, whether heat and air circulate through the product properly, whether the product would survive a fall, and the like. The model validation tools 306 may include, for example, validation of design tolerances, tolerance stackup validation, assembly simulation, fully-integrated mechanism simulation, simulation of welded structures, product failure prediction, prediction of buckling and collapse, heating and cooling simulation, simulation of drop test and impact, nonlinear dynamics, simulation of loading effects, simulation of plastic parts, fluid flow simulation, and the like. In some implementations, the functionality of the model completeness verification tools 304 and the model validation tools 306 are combined into a single model validation module.

The prototype creation tools 308 may allow the user to receive a prototype of the product based on the model. The prototype creation tools 308 may allow the user to request changes to the prototype. For example, the user may wish to add colors, change dimensions, or use other types of materials. Model finalization tools 310 may allow the user to create a final model of the product to be fabricated based on the output of the model validation tools 306 and the prototype creation tools 310. The finalized models may then be made available in the models database 114 and/or the content catalog database 116 by using the model database and catalog content creation tools 312. The model database and catalog content creation tools 312 may be used to request permission from the user to include the model in the models database 114 and/or to represent the product, its components, or any kits useable to create the product in the catalog content database 116.

The user interaction framework 110 may also be used to provide access to an existing model in the models database and/or an existing product, product component or product kit in the catalog content database. For example, the user interaction framework 110 may include a search and query function, a recommendation function, a browse function, and other functions that allow the user to select existing models and/or products from the databases. The user interaction framework 110 may offer a variety of search strategies in addition to performing text searching (e.g., search by title, subject, keyword, etc.). Some examples of search strategies include allowing a user to select items from a catalog and then basing the search on metadata associated with the selected item, allowing the user to highlight content while browsing a web site or viewing a work and then basing the search on metadata associated with the highlighted items. For example, the framework 110 may allow the user to select a "see 10 more like this" option when viewing or browsing content and then basing the search on corresponding metadata, etc.

Figure 4:
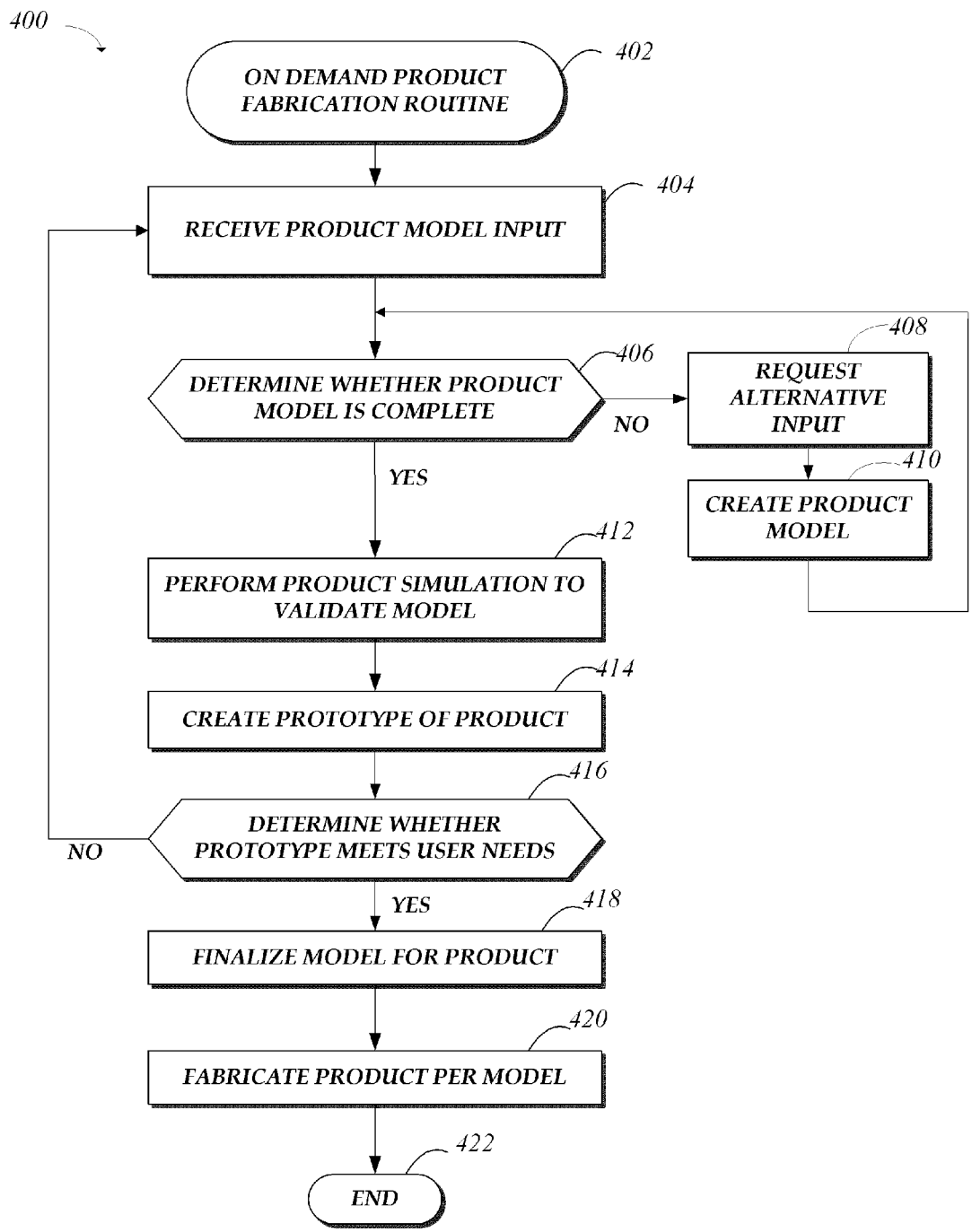
FIG. 4 is a flow diagram of an illustrative example of a method implemented by an on-demand product fabrication system.

FIG. 4 is a flow diagram of an illustrative example of a method 400 that can be implemented by the on-demand product fabrication system 100. The method begins at block 402 and then proceeds to block 404, in which the on-demand product fabrication system 100 receives a product model input. In some embodiments, the product model input may be from a user and communicated via a computing device 102-106 through the network 108. In some embodiments, the product model input may be received from a models database such as, e.g., the database 114.

After receiving the product model input at block 44, the on-demand product fabrication system 100 may determine at block 406 whether the product model is complete. In some embodiments, a product model may be considered incomplete if the model is not a manufacturable model as described above. Some models which may be considered manufacturable models include models created using 3D computer-aided design (CAD) software such as, for example, SolidWorks®, VectorWorks®, AutoCAD®, and the like.

At block 406, if the on-demand product fabrication system determines that the product model is complete, the method 400 continues to block 412. If the on-demand product fabrication system determines that the product model is incomplete, the method 400 continues to block 408 where the on-demand product fabrication system can request alternative input from the user. In some embodiments, the alternative input may include a photograph of the product to be fabricated. For example, the product may be photographed against a background grid that provides information on dimensions of the product. In some embodiments, the alternative input from the user may include a physical (e.g., clay prototype) or electronic model of the product or the product itself. For example, a 3D scanner may be used to provide a digital model of the product. Using optional input from the user, the on-demand product fabrication system may generate a product model at block 410. Once the product model is generated at block 410, the on-demand product fabrication system returns to block 406 and determines whether the product model is complete. If the system determines that the product model is still incomplete, blocks 408 and 410 are repeated until the model is determined to be complete at block 406.

In the embodiment illustrated in FIG. 4, if the product model received from the user or the product model generated by the on-demand product fabrication system at block 410 is determined to be complete at block 406, the method 400 continues to block 412 and performs a product simulation to validate the model. As explained above, product simulation may be used to subject the model to similar conditions as in the real world, including stresses, impact, heat, airflow, and the like. Once the product simulation validates the model, a prototype of the product can be created at block 414. The prototype of the product may then be provided to the user for a determination of whether the prototype meets the user's needs at block 416. The prototype may be provided to the user via a variety of delivery means (e.g., airmail, ground shipping, etc.). If the user is satisfied with the prototype, then the method 400 continues to block 418. If the user is not satisfied with the prototype, blocks 404 through 416 may be iterated until the user is satisfied with the prototype. At block 418, the model for the product is updated based on the results of the product simulation of the model and/or the prototype iterations. When the user is satisfied with the prototype, the manufacturable model can be finalized for production of products based on the finalized model. The finalized product is ready to be fabricated at block 420. In some embodiments, the product may be fabricated geographically locally to the on-demand product fabrication system 100, and in other embodiments, the product may be fabricated geographically remotely from the system 100. Once the on-demand product fabrication system has fabricated a product on demand, the method ends in block 422.

Figure 5:
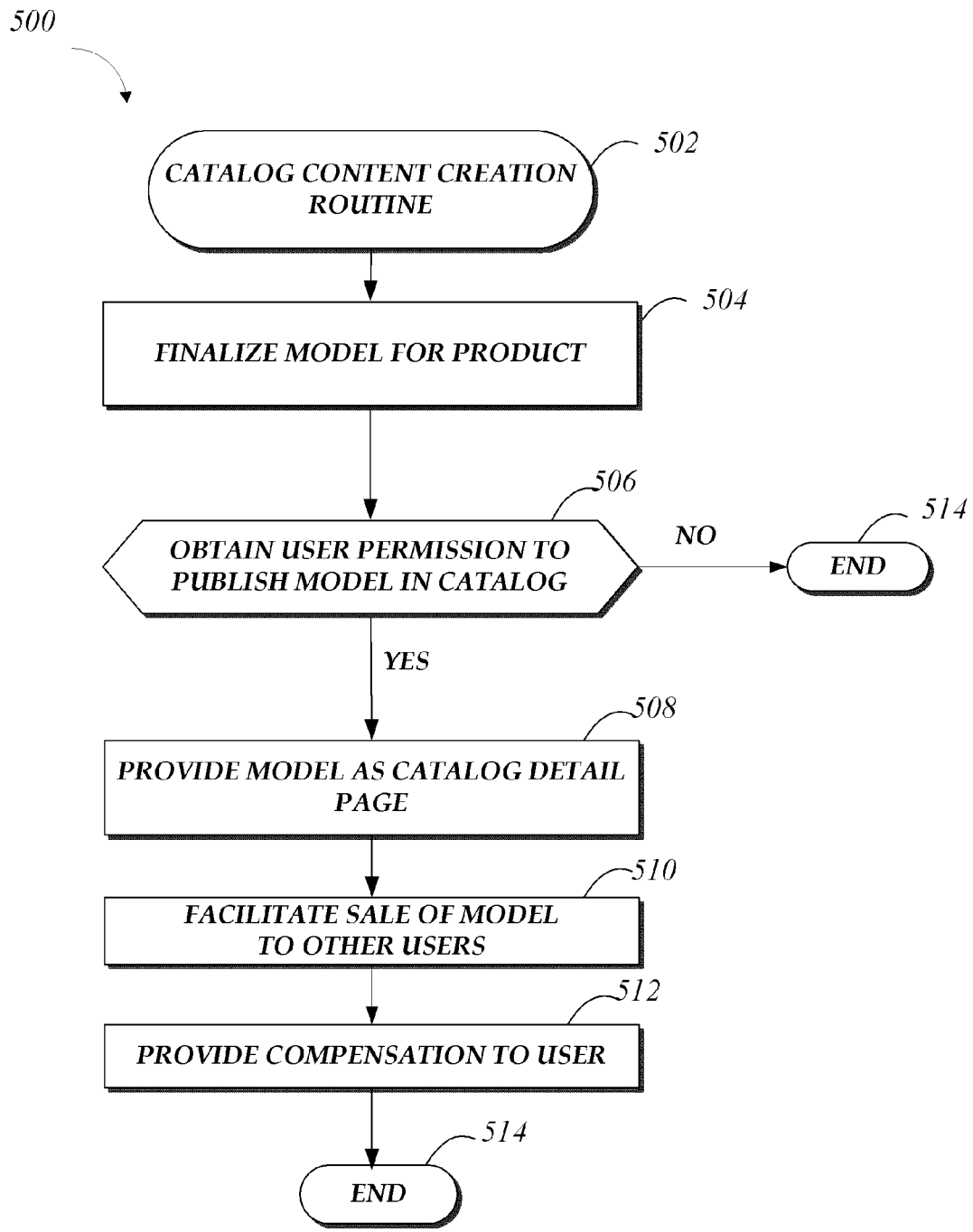
FIG. 5 is a flow diagram of an illustrative example of a method implemented by the content aggregation module for creating catalog content.

FIG. 5 is a flow diagram of an illustrative example of a method 500 implemented by the content aggregation module 112 for creating catalog content. The catalog content can be used by an e-commerce system to provide information about products and product models available from the e-commerce system. For example, the e-commerce system may provide an electronic catalog (e.g., available over the network 108) from which users can select items. The method 500 begins at block 502 and then proceeds to block 504, which, in some implementations, can be the same as block 418 described above. The method 500 continues to block 506 and obtains user permission to publish information related to the model in the electronic catalog. If the user does not grant permission to publish the model in the catalog, the method 500 ends at block 514. If the user does grant permission, the method 500 continues to block 508 where a catalog detail page is generated for the model (an example of a catalog detail page will be described with reference to FIG. 8). The catalog detail page may include details such as, e.g., images and information about the product that can be fabricated using the model, dimensions of the product, materials from which the product can be fabricated, material tolerances of the product, availability of the product as a sub-component of another existing product, availability of sub-components of the product, availability of a kit of sub-components of the product available for final assembly, and the like. In some cases, a user may wish to select the model itself (instead of or in addition to) a fabricated product. Therefore, the catalog detail page may also contain details about a license for the model. For example, the license may be single-use or multiple-use, may permit modification of the model to produce derivative products, or may have other restrictions or requirements. The license may be fee-based such as, e.g., requiring a fee for the model and/or a royalty based on the number of products fabricated from the model. In some implementations, the on-demand fabrication system may charge the user a fee to display the detail page for the model or product or may require payment of fees based on the licensing fees or royalties. The method 500 moves to block 510 where the model's sale or licensing is facilitated to other users. For example, the model may be sold, rented, licensed, downloaded, or the like, by other users. At block 512, compensation is provided to the user who input the model based on the sale, license, rental and/or download of the model to other users. Once the content aggregation module 112 has provided compensation to the user for the model, the method ends in block 514.

Figure 6:
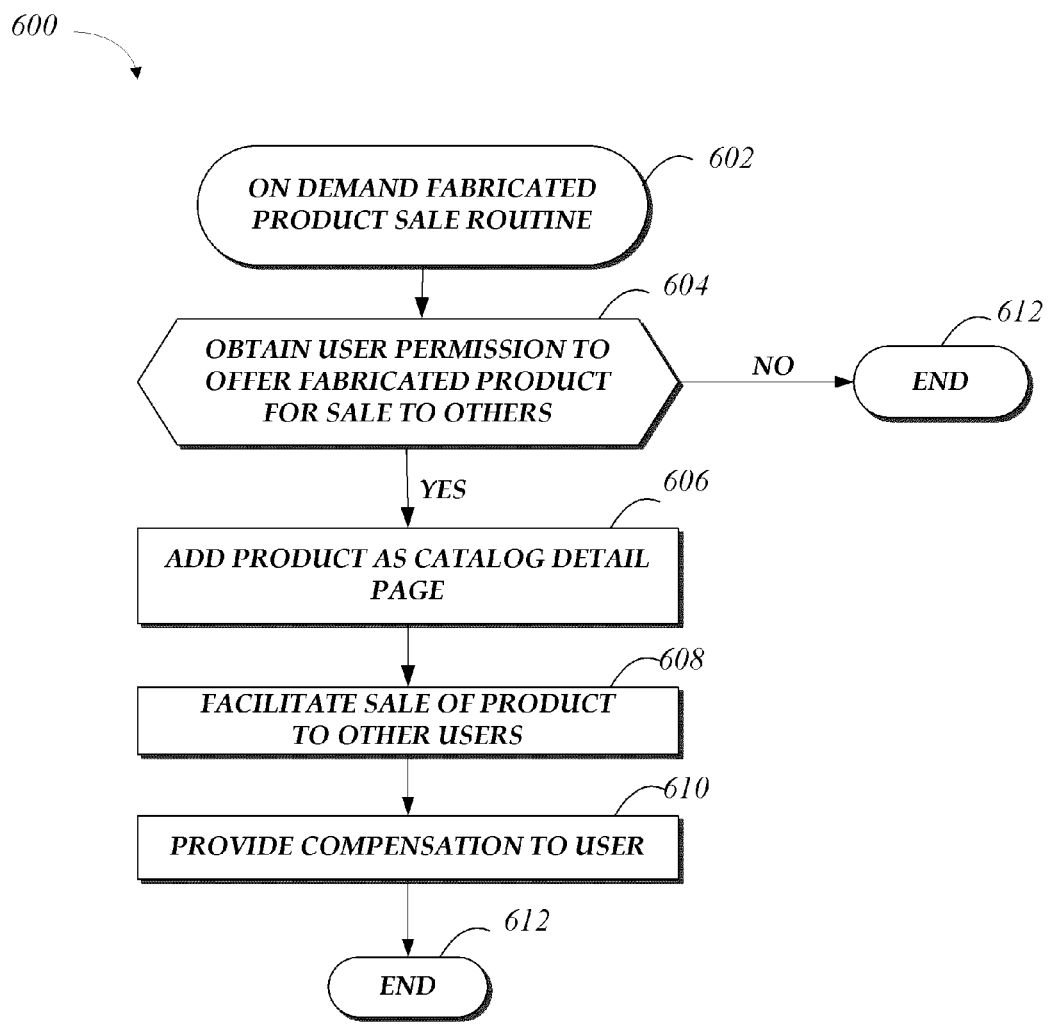
FIG. 6 is flow diagram of an illustrative example of a method implemented by the content aggregation module for reselling a product fabricated on demand.

FIG. 6 is flow diagram of an illustrative example of a method 600 that can be implemented by the content aggregation module 112 for selling a product fabricated on demand. The method 600 begins at block 602 and then proceeds to block 604, where the content aggregation model 112 obtains user permission to offer a fabricated product for sale to others. If permission is not granted, the method ends at block 612. If permission is granted, the method 600 continues to block 606 where a catalog detail page is created for the product. The catalog detail page may include details such as, e.g., images and information about the product that can be fabricated using the model, dimensions of the product, materials from which the product can be fabricated, material tolerances of the product, availability of the product as a sub-component of another existing product, availability of sub-components of the product, availability of a kit of sub-components of the product available for final assembly, and the like. The catalog detail page may also contain information about the price of the product for a sale, rental and the like. The method 600 continues to block 608 where the product's sale is facilitated to other users. The product may be sold, rented, or the like, by other users. At block 610, compensation is provided to the user who input the model of the product, based on the sale, rental or the like of the product to other users. Once the content aggregation module has provided compensation to the user, the method 600 ends in block 612.

Figure 7:
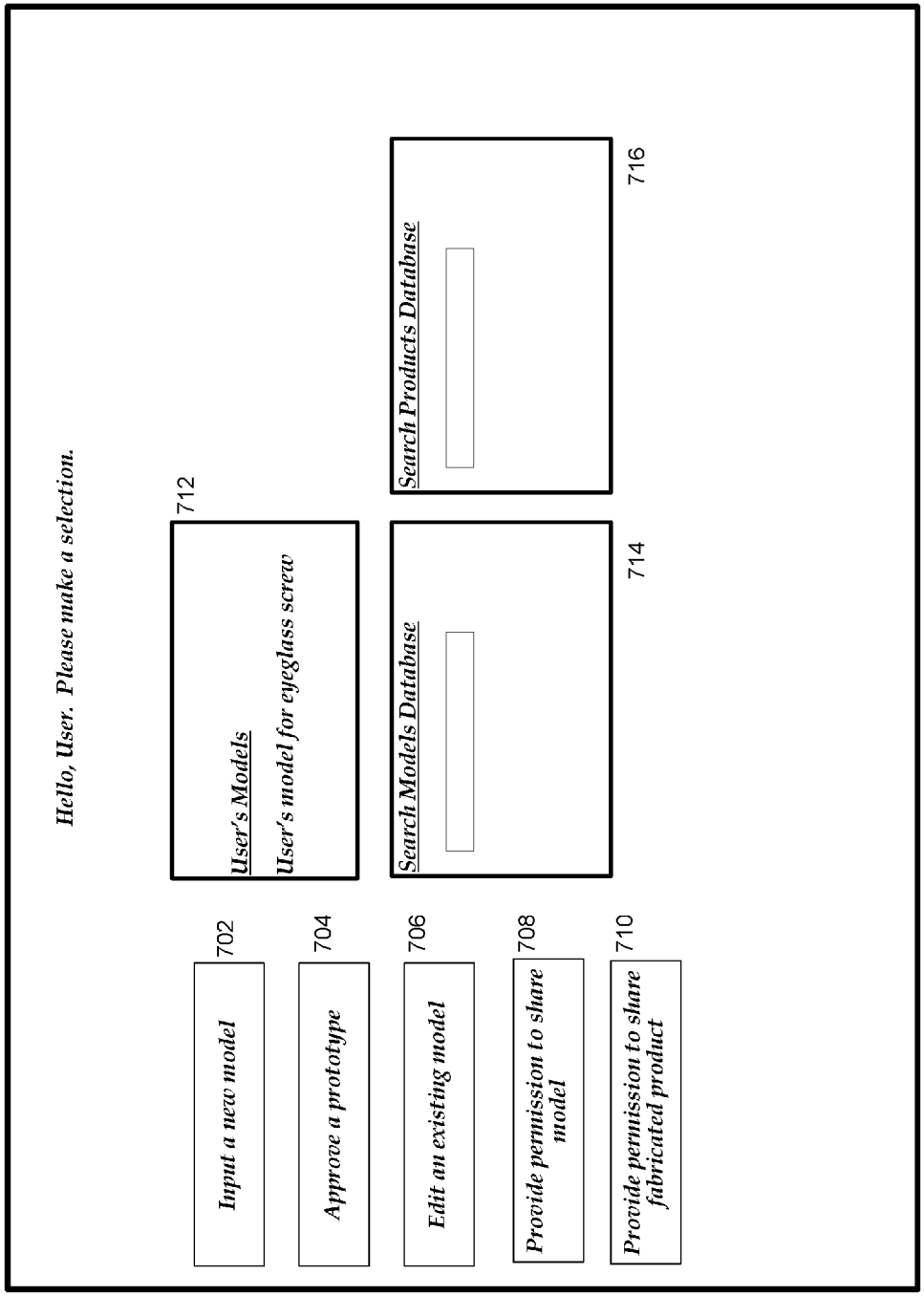
FIG. 7 is a display diagram schematically illustrating an example of an interface page, as may be provided by a user interaction tool associated with an on-demand fabrication system.

FIG. 7 is a display diagram schematically illustrating an example of an interface page that may be provided by the user interaction framework 110 associated with an on-demand fabrication system 100. The interface page 700 may be displayed to a user, for example, via a web browser or by other programmatic interaction with the system 100. In some embodiments, the interface page 700 is accessed, at least in part, via an Internet browser application at one of the computing devices 102-106. From the interface page 700, the user may begin to create a new model by selecting an INPUT A NEW MODEL button 702. Likewise, the user may be able to approve a prototype by selecting an APPROVE A PROTOTYPE button 704. The user may also be able to edit an existing model and finalize it by selecting an EDIT AN EXISTING MODEL button 706. The user may be able to provide permission to share an existing model by selecting a PROVIDE PERMISSION TO SHARE MODEL button 708. Using this button, the user can grant permission to publish information related to the model in the electronic catalog. After this permission is granted, a catalog detail page can be generated for the model, including, for example, details about a license for the model. With the catalog detail page in place, the model's sale or licensing is facilitated to other users. The user may also be able to provide permission to share a fabricated product by selecting a PROVIDE PERMISSION TO SHARE FABRICATED PRODUCT button 710. After granting this permission, a catalog detail page can be generated for the product. The catalog detail page may include details about the product about the price of the product for a sale, rental and the like. With the creation of the catalog detail page, the product's sale, rental, or the like, can be facilitated to other users. Based on the sale, rental or the like of the product to other users, in some implementations, compensation can be provided to the user.

In some embodiments, a USER'S MODELS display area 712 shows various models that the user has started but not yet completed. For example, in the embodiment illustrated in FIG. 7, the user has provided a manufacturable model for a screw for a pair of eyeglasses. Therefore, the USER'S MODELS display area 712 includes "User's model for eyeglass screw." In some embodiments, a SEARCH MODELS DATABASE display area 714 provides a mechanism through which the user may search for additional models in the models database. The SEARCH MODELS DATABASE display area 712 may include a text field that allows the user to enter search terms (e.g., "eyeglass"). In some embodiments, from a SEARCH PRODUCTS DATABASE display area 716, the user may select to view additional products. For example, a user accessing the on-demand fabrication system 100 may search for eyeglass screws similar to those provided by the user's manufacturable model. Accordingly, use of the system 100 may advantageously facilitate obtaining components or parts of products that have been broken and need to be repaired.

Figure 8:
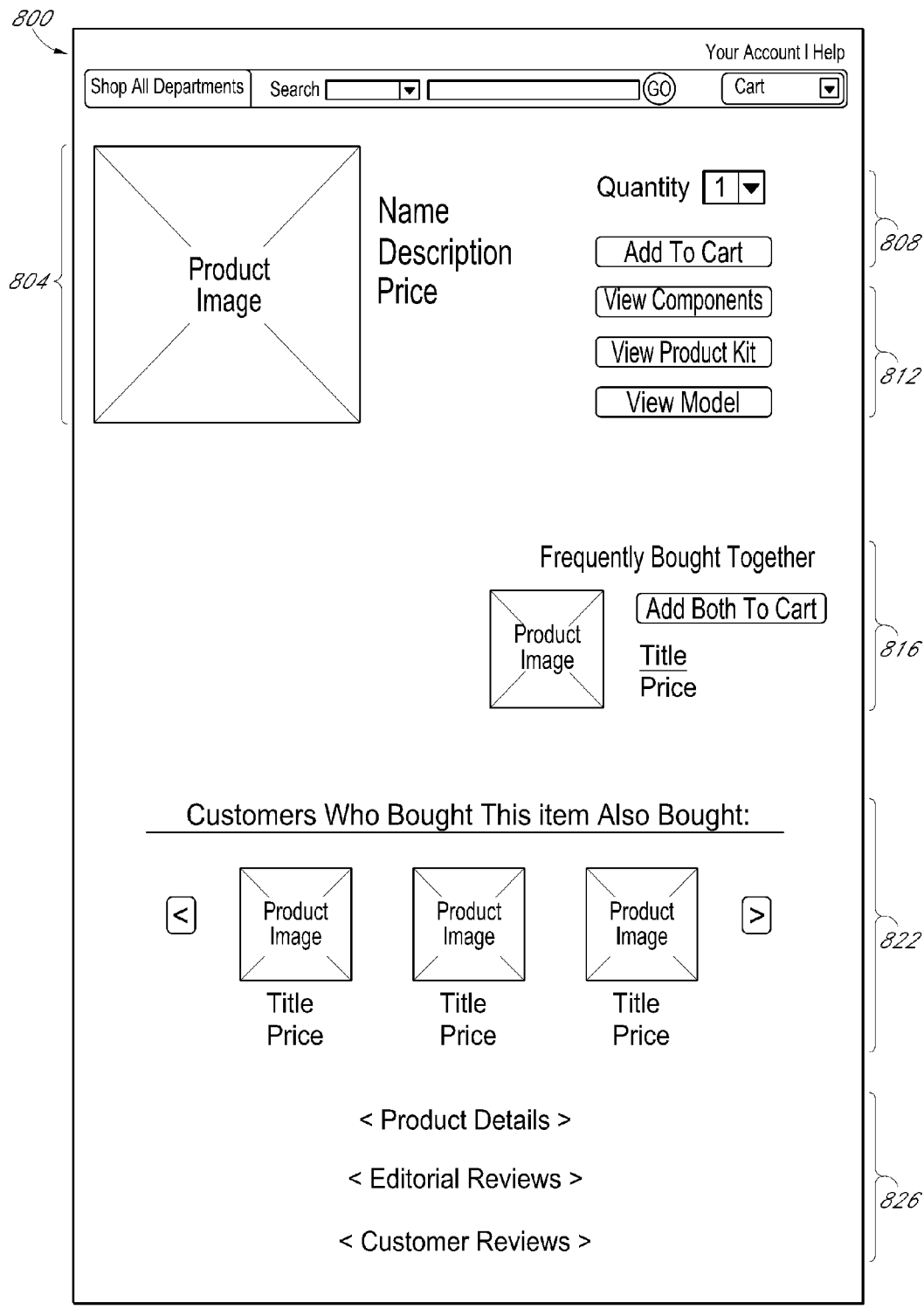
FIG. 8 schematically illustrates an example format of a product detail page that may be generated by an on-demand fabrication system.

FIG. 8 schematically illustrates an example format of a product detail page that may be generated by the on-demand fabrication system 100. The representative display pages are presented as they may appear, for example, in a web browser. In some embodiments, the item may be a manufacturable model, and in other embodiments, the item may be a product. The web page includes a number of distinct areas that can be used to display page features 804-826 that contain various types of content. The example page features 804-826 illustrated in FIG. 8 are intended to schematically illustrate certain types of page features that can be used on a display page but are not intended to be limiting. For example, the content, appearance, positioning, sizes, and so forth of the page features may be different than shown.

The example page feature 804 includes an image of the product and a brief description of the item (e.g., name, description, price, etc.). The page feature 808 is an area of the page 800 allowing a user/customer to add one (or more) quantities of the item to an electronic shopping cart or to a wishlist for future purchase. The page feature 808 may be presented prominently (and in a standard position) on the display page 800 so that the customer can easily order the item. The page feature 812 provides links to components of the product, a product kit for sub-components of the product, and the model associated with the product. The page feature 816 shows an additional item that is frequently purchased together with the product described in page feature 804. The page feature 822 shows other items purchased by customers who also purchased the item described on the page 800. The page feature 826 includes areas for a detailed description, editorial reviews, and customer reviews of the item. Additional or different page features can be used in other display pages.

CONCLUSION

Depending on the embodiment, certain acts, events, or functions of any of the algorithms, methods, or processes described herein can be performed in a different sequence, can be added, merged, or left out all together (e.g., not all described acts or events are necessary for the practice of the algorithms, methods, or processes). All possible combinations and subcombinations are intended to fall within the scope of this disclosure. Moreover, in certain embodiments, acts or events can be performed concurrently, e.g., through multi-threaded processing, interrupt processing, or multiple processors or processor cores or on other parallel architectures, rather than sequentially.

The various illustrative logical blocks, modules, and algorithm steps described in connection with the embodiments disclosed herein can be implemented as electronic hardware, computer software, or combinations of both. To clearly illustrate this interchangeability of hardware and software, various illustrative components, blocks, modules, and steps have been described above generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of the disclosure.

The various illustrative logical blocks and modules described in connection with the embodiments disclosed herein can be implemented or performed by a machine, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor can be a microprocessor, a controller, microcontroller, or state machine, combinations of the same, or the like. A processor can also be implemented as a combination of computing devices, e.g., a combination of a DSP and a microprocessor, a plurality of microprocessors, one or more microprocessors in conjunction with a DSP core, or any other such configuration.

The steps of a method, process, or algorithm described in connection with the embodiments disclosed herein can be embodied directly in hardware, in a software module executed by a processor, or in a combination of the two. A software module may be stored on any type of non-transitory computer-readable medium or computer storage device, such as a hard drive, solid state memory, optical disc, and/or the like. A storage medium can be coupled to the processor such that the processor can read information from, and write information to, the storage medium. In some embodiments, the storage medium can be integral to the processor. The processor and the storage medium can reside in an ASIC. The ASIC can reside in a user terminal. In some embodiments, the processor and the storage medium can reside as discrete components in a user terminal. The systems and modules may also be transmitted as generated data signals (e.g., as part of a carrier wave or other analog or digital propagated signal) on a variety of computer-readable transmission mediums, including wireless-based and wired/cable-based mediums, and may take a variety of forms (e.g., as part of a single or multiplexed analog signal, or as multiple discrete digital packets or frames).

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

While the above detailed description has shown, described, and pointed out novel features as applied to various embodiments, it will be understood that various omissions, substitutions, and changes in the form and details of the devices or algorithms illustrated can be made without departing from the spirit of the disclosure. As will be recognized, certain embodiments of the inventions described herein can be embodied within a form that does not provide all of the features and benefits set forth herein, as some features can be used or practiced separately from others. No element or feature is necessary or indispensable to each embodiment. The scope of certain inventions disclosed herein is indicated by the appended claims rather than by the foregoing description. All changes which come within the meaning and range of equivalency of the claims are to be embraced within their scope.

What is claimed is:

1. A system for providing fabrication of a product on demand, the system comprising:

at least one physical data repository configured to store a manufacturable model, the manufacturable model comprising electronic information providing a three-dimensional representation of the product; and a physical computer system programmed to use data from the at least one physical data repository to:

generate a first display page for presentation to a user of an electronic catalog system, the first display page including information about the product, the information indicating that the product, the manufacturable model, or both are available for selection via the electronic catalog system;

electronically receive, from a user, a request to obtain the product or the manufacturable model;

in response to a request from the user for the product, communicate information related to the manufacturable model to cause the product to be produced based at least in part on the information related to the manufacturable model;

in response to a request from the user for the manufacturable model, electronically communicate to the user information related to the manufacturable model;

wherein the physical computer system is further programmed to:

validate the manufacturable model based on at least one of:
(1) verifying that the manufacturable model represents a three-dimensional representation of the product,
(2) verifying the manufacturable model's representation of product dimensions or configuration,
(3) verifying the manufacturable model's representation of material tolerance, or
(4) testing simulated response of a model of the product to environmental conditions; and, generate a second display page comprising information about at least one of the product or the manufacturable model, the second display page presentable to the user but not to other users of the electronic catalog system.

2. The system of claim 1, wherein the physical computer system is further programmed to receive the manufacturable model from a first user of the electronic catalog system and wherein the request to obtain the product or the manufacturable model is received from a second user of the electronic catalog system.

3. The system of claim 2, wherein the physical computer system is further programmed to initiate providing a payment to the first user in response to the request by the second user for the product, the manufacturable model, or both.

4. The system of claim 2, wherein the physical computer system is further programmed to:

provide to the second user information related to a license from the first user for use of the manufacturable model; and receive from the second user the second user's consent to the license.

5. The system of claim 4, wherein the physical computer system is further programmed to communicate to the second user information related to the manufacturable model only after receiving the second user's consent to the license.

6. The system of claim 2, wherein the physical computer system is further programmed to receive, from the first user, one or more attributes associated with the manufacturable model, the one or more attributes comprising information related to at least one of: product dimensions or configuration, material tolerances, and environmental conditions.

7. The system of claim 2, wherein the physical computer system is further programmed to receive, from the first user, permission to present information about the product on the first display page.

8. The system of claim 2, wherein the product comprises a plurality of components, the information about the product comprises information about at least some of the plurality of components, and the request from the second user comprises a request to obtain at least one of the plurality of components.

9. The system of claim 1, wherein a second product available from the electronic catalog system comprises or is usable with the product, and the physical computer system is further programmed to display information about the second product to users of the electronic catalog system.

10. The system of claim 1, wherein the product comprises a plurality of components for assembly, and the physical computer system is further programmed to provide instructions for assembly.

11. The system of claim 1, wherein the information related to the manufacturable model to cause the product to be produced is communicated to a product fulfillment center having capability to fabricate the product using a three-dimensional printer.

12. The system of claim 1, wherein the information related to the manufacturable model to cause the product to be produced is communicated to a three-dimensional printer.

13. The system of claim 1, wherein the manufacturable model comprises a three-dimensional computer-aided design electronic file.

14. The system of claim 1, wherein the three-dimensional printer comprises a three-dimensional milling machine, a computer numerically controlled machine, or a laser cutter.

15. The system of claim 1, wherein the physical computer system is further programmed to, in response to the request from the user for the product, electronically communicate the information related to the manufacturable model to a product fulfillment center having capability to fabricate the product using the three-dimensional printer.

16. The system of claim 1, wherein the physical computer system is further programmed to:

receive the manufacturable model from the user of the electronic catalog system;

receive, from the user, a request to obtain a prototype of the product;

in response to a request from the user for the prototype of the product, communicate information related to the manufacturable model to a three-dimensional printer to fabricate a prototype of the product based at least in part on the information related to the manufacturable model.

17. The system of claim 16, wherein the physical computer system is further programmed to receive an updated manufacturable model from the user, the updated manufacturable model based at least in part on the information presented on the second display page.

18. The system of claim 17, wherein the physical computer system is further programmed to fabricate, by the three-dimensional printer, an updated prototype based at least in part on the updated manufacturable model.

19. The system of claim 18, wherein the receipt of an updated manufacturable model from the user and the fabrication of an updated prototype are iterated a plurality of times.

20. The system of claim 16, wherein the physical computer system is further programmed to receive feedback from the user about the prototype, and update the manufacturable model based at least in part on the feedback from the user about the prototype.

21. The system of claim 20, wherein the feedback from the user comprises instructions from the user about changes to be made to the prototype and the system is configured to update the manufacturable model by implementing the instructions from the user.

22. A system for providing fabrication of a product on demand, the system comprising:
- a three-dimensional printer;
- at least one physical data repository configured to store a manufacturable model comprising electronic information providing a three-dimensional representation of the product; and
- a physical computer system programmed to use data from the at least one physical data repository to:
  - generate a first display page for presentation to a user of an electronic catalog system, the first display page including information about the product, the information indicating that the product is available for selection via the electronic catalog system,
  - electronically receive, from a user, a request to obtain the product, and
  - in response to the request from the user for the product, communicate information related to the manufacturable model to the three-dimensional printer for fabrication of the product based at least in part on the information related to the manufacturable model,
- wherein the physical computer system is further programmed to:
  - validate the manufacturable model based on at least one of:
    (1) verifying that the manufacturable model represents a three-dimensional representation of the product,
    (2) verifying the manufacturable model's representation of product dimensions or configuration,
    (3) verifying the manufacturable model's representation of material tolerance, or
    (4) testing simulated response of a model of the product to environmental conditions; and
  - generate a second display page comprising information about at least one of the product or the manufacturable model, the second display page presentable to the user but not to other users of the electronic catalog system.

23. A system for providing fabrication of a product on demand, the system comprising:
- a three-dimensional printer; and
- a computer system comprising a memory and a processor, the computer system in communication with the three-dimensional printer, the computer system configured to:
  - store a manufacturable model, the manufacturable model comprising electronic information providing a three-dimensional representation of the product;
  - generate a first display page for presentation to a user of an electronic catalog system, the first display page including information about the product;
  - electronically receive a request to fabricate the product, wherein the request is based at least in part on a selection from the electronic catalog system comprising the first display page including information about the product; and
  - in response to the request for the product, issue an instruction to the three-dimensional printer to fabricate the product based at least in part on the information related to the manufacturable model;
- wherein the computer system is further programmed to:
  - validate the manufacturable model based on at least one of:
    (1) verifying that the manufacturable model represents a three-dimensional representation of the product,
    (2) verifying the manufacturable model's representation of product dimensions or configuration,
    (3) verifying the manufacturable model's representation of material tolerance, or
    (4) testing simulated response of a model of the product to environmental conditions; and,
  - generate a second display page comprising information about at least one of the product or the manufacturable model, the second display page presentable to the user but not to other users of the electronic catalog system.

* * * * *